United States Patent [19]

Ebina et al.

[11] Patent Number: 4,654,525
[45] Date of Patent: Mar. 31, 1987

[54] OPTICAL ROTARY ENCODER

[75] Inventors: Kiyoshi Ebina; Kazuhira Nakao, both of Nara; Zempei Tani, Tondabayashi, all of Japan

[73] Assignee: Sharp Kabushiki Kaisha, Osaka, Japan

[21] Appl. No.: 521,933

[22] Filed: Aug. 10, 1983

[30] Foreign Application Priority Data

Aug. 31, 1982 [JP] Japan ............................... 57-152014
Aug. 31, 1982 [JP] Japan ........................... 57-132576[U]

[51] Int. Cl.⁴ ............................................. G01D 5/34
[52] U.S. Cl. ........................... 250/231 SE; 250/237 G
[58] Field of Search ............. 250/231 SE, 237 G, 208, 250/209; 356/395; 33/125 C; 340/347 P

[56] References Cited

U.S. PATENT DOCUMENTS

| | | | |
|---|---|---|---|
| 3,304,434 | 2/1967 | Koster | 250/231 SE |
| 3,709,611 | 1/1973 | Taisne | 250/237 G |
| 3,757,128 | 9/1973 | Vermeulen | 250/231 SE |
| 3,809,895 | 5/1974 | Taisne | 250/237 G |
| 4,097,150 | 6/1978 | Wu | 250/237 G |
| 4,118,129 | 10/1978 | Grundherr | 250/205 |
| 4,152,579 | 5/1979 | Feinland | 250/237 G |
| 4,496,835 | 1/1985 | Boella et al. | 340/347 P |

Primary Examiner—David C. Nelms
Attorney, Agent, or Firm—Birch, Stewart, Kolasch & Birch

[57] ABSTRACT

An optical rotary encoder includes a slit plate having a plurality of circumferentially aligned slits of a pitch P, a light emitting diode, and a light responsive section. The light responsive section includes four photodiodes formed on a single substrate. The four photodiodes are aligned in the tangential direction of the slit plate with the interval corresponding to ¼ P. Output signals derived from each of the four photodiodes are introduced into a detection circuit for determining the angular position and velocity of a rotating shaft to which the slit plate is secured.

12 Claims, 7 Drawing Figures

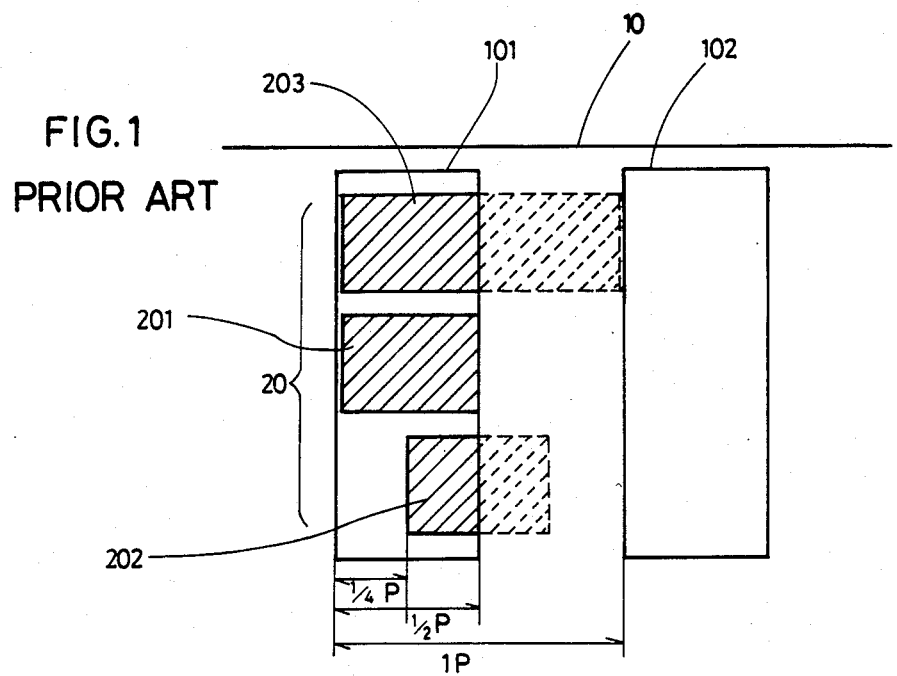

OPTICAL ROTARY ENCODER

BACKGROUND OF THE INVENTION

1. Field of the Invention

The present invention relates to an optical rotary encoder for detecting angular position and velocity of a rotating wheel.

2. Description of Prior Art

An optical rotary encoder has been developed, which includes a slit plate secured to a shaft or a rotating wheel. A light emitting element and a plurality of light responsive elements are disposed in a manner such that the light beam emitted from the light emitting element toward the light responsive elements is interrupted by the slit plate. The slit plate is provided with a plurality of circumferentially aligned slits so that the light responsive elements periodically receive the light beam through the slits as the slit plate rotates in unison with the rotation of the shaft of the rotating wheel. Output signals derived from the light responsive elements are applied to a detection circuit for determining the angular position and velocity of the rotating wheel.

The conventional optical encoder includes at least two light responsive elements, which are offset from each other in the tangential direction by a distance equal to one half of the width of a slit, and are spaced from each other in the radial direction by a predetermined distance. Because of the displacement in the radial direction, it was difficult to adjust the levels of the output signals developed from the two light responsive elements. Furthermore, the light responsive elements occupy a considerably large space, which resulted in enlargement of the optical rotary encoder.

An example of an optical encoder is disclosed in U.S. Pat. No. 4,224,514, "Optical Encoder", issued on Sept. 23, 1980. The encoder disclosed in U.S. Pat. No. 4,224,514 ensures an accurate detection. However, the encoder disclosed in U.S. Pat. No. 4,224,514 requires two pairs of photosensors, each pair including two photosensors spaced from each other in the radial direction. Therefore, the encoder of U.S. Pat. No. 4,224,514 occupies a large space. Furthermore, the signal level adjustment is difficult.

In order to compensate for variations in the light beam intensity emitted from the light emitting element, in the conventional optical encoder, another light responsive element is disposed at a position which is suited for continuously receiving the light beam emitted from the light emitting element without being interrupted by the slit plate. An output signal derived from this light responsive element is used to determine a reference intensity level. This additional light responsive element further enlarges the optical encoder.

Furthermore, in the conventional optical encoder, the detection circuit is discrete from the substrate of the light responsive elements. Therefore, the system requires a cable for transmitting the output signals derived from the light responsive elements to the detection circuit. The cable makes the system large, and creates noises in the output signals derived from the light responsive elements.

OBJECTS AND SUMMARY OF THE INVENTION

Accordingly, an object of the present invention is to provide a novel optical rotary encoder which ensures an accurate detection operation.

Another object of the present invention is to provide a compact size optical encoder.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, four photodiodes are aligned in the tangential direction within one pitch of the slits formed in the slit plate. The first and third photodiodes develop inverted signals with each other. The second and fourth photodiodes develop inverted signals with each other. The output signals obtained from the first and third photodiodes lead or lag the output signals derived from the second and fourth photodiodes by 90°. That is, each photodiode is positioned with the interval of ¼ pitch of the slits, and each photodiode independently develops an output signal.

In a preferred form, the four photodiodes are formed on a common single substrate and are electrically separated from each other. A detection circuit is also formed on the common single substrate. The detection circuit includes amplifying circuits for amplifying output signals derived from the four photodiodes, respectively, and comparators for comparing the levels of signals developed from the amplifying circuits.

The inverted signals obtained from the first and third photodiodes, and from the second and fourth photodiodes are utilized for compensating for the variations in the intensity of the light beam emitted from a light emitting element which is located at the opposite side of the slit plate. Thus, the additional light responsive element is not required, which was positioned in the conventional system outside of the slit plate to continuously receive the light beam emitted from the light emitting element.

Because all of the photodiodes are aligned in the tangential direction, the system becomes compact and the signal level adjustment becomes easy. Furthermore, the setting of the photodiodes with respect to the location of the slit plate does not require a precise adjustment. Moreover, since the detection circuit is formed on the same substrate as the photodiodes, the conventional signal cable is omitted.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 1 is a schematic plan view of an essential part of the conventional optical rotary encoder;

FIG. 2 is a schematic plan view of an essential part of an embodiment of an optical rotary encoder of the present invention;

DESCRIPTION OF THE PREFERRED EMBODIMENTS

Figure 3:
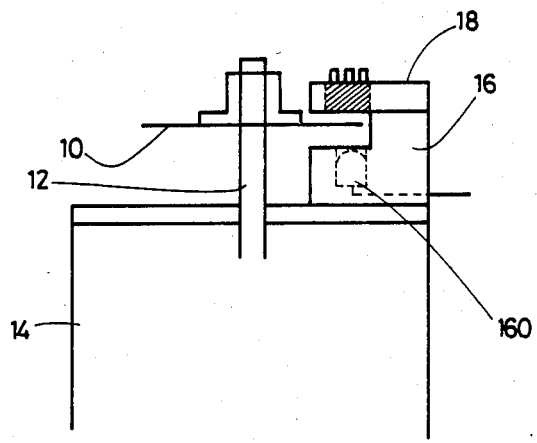
FIG. 3 is a side view of an embodiment of an optical rotary encoder of the present invention.

FIG. 1 shows an example of arrangement of photodiodes in the conventional optical rotary encoder. The optical rotary encoder generally includes a slit plate 10 mounted on a rotating shaft. The slit plate 10 is provided with a plurality of circumferentially aligned slits 101, 102, - - - . A light emitting element (not shown in FIG. 1) is disposed at one side of the slit plate 10. A plurality of photodiodes 20 are disposed at the opposite side of the slit plate 10 so that the photodiodes 20 periodically receive the light beam emitted from the light emitting element as the slit plate 10 rotates. Output signals derived from the photodiodes 20 are applied to a detection circuit to determine the angular position and velocity of the rotating shaft.

The photodiodes 20 in the conventional optical rotary encoder include a first photodiode 201 and a second photodiode 202, which are offset from each other in the tangential direction by a distance equal to one half of the width of the slit 101 (102, - - - ) so as to develop output signals, one signal leading or lagging the other by 90° depending on the direction of rotation of the shaft. The photodiodes 20 further include a third photodiode 203 for compensating for variations in the intensity of the light beam emitted from the light emitting element. That is, the third photodiode 203 functions as a monitor sensor. The locations of the first through third photodiodes 20 are precisely determined by a mask disposed on the light receiving surface.

The conventional optical rotary encoder of the type shown in FIG. 1 occupies a considerably large size because the photodiodes 20 are separated from each other in the radial direction of the slit plate 10. Furthermore, an accurate detection is ensured only when the locations of the first and second photodiodes 201 and 202 are precisely adjusted with respect to the location of the slit 101 (102, - - - ) on the slit plate 10. Moreover, even when the first and second photodiodes 201 and 202 have the same size, the amount of the light beam impinging on the first photodiode 201 is greater than that impinging on the second photodiode 202 because the two photodiodes 201 and 202 are aligned along the radial direction of the elongated slit 101 (102, - - - ). This complicates the adjustment of the signal level developed from the first and second photodiodes 201 and 202.

FIG. 2 shows arrangement of photodiodes in an embodiment of an optical rotary encoder of the present invention. Like elements corresponding to those of FIG. 1 are indicated by like numerals.

Four photodiodes 30 are aligned in the tangential direction of the slit plate 10 within one pitch of the slits 101, 102, - - - . More specifically, the four photodiodes 30 are aligned with the interval of ¼ pitch, and the four photodiodes 30 are formed on a common single semiconductor substrate and are electrically separated from each other. That is, the four photodiodes 30 comprise a first photodiode 301, a second photodiode 302, a third photodiode 303 and a fourth photodiode 304.

FIG. 3 schematically shows the construction of the optical rotary encoder of the present invention. Like elements corresponding to those of FIG. 2 are indicated by like numerals. The slit plate 10 is secured to a rotating shaft 12 of a motor 14. The optical rotary encoder of the present invention includes a light emitting section 16 and a light responsive section 18, which, in combination, substantially sandwich the slit plate 10. The light emitting section 16 includes a light emitting diode 160. The light responsive section 18 includes the above-mentioned four photodiodes 30.

Figure 4:
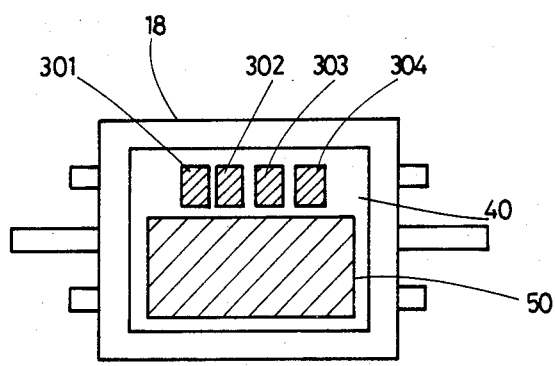
FIG. 4 is a plan view of an essential part of the optical rotary encoder of FIG. 3.

FIG. 4 schematically shows the light responsive section 18. As already discussed above, the first through fourth photodiodes 301, 302, 303 and 304 are formed on a common single semiconductor substrate 40. A detection circuit 50, to which the output signals of the first through fourth photodiodes 301, 302, 303 and 304 are applied, is formed on the common single semiconductor substrate 40.

Figure 5:
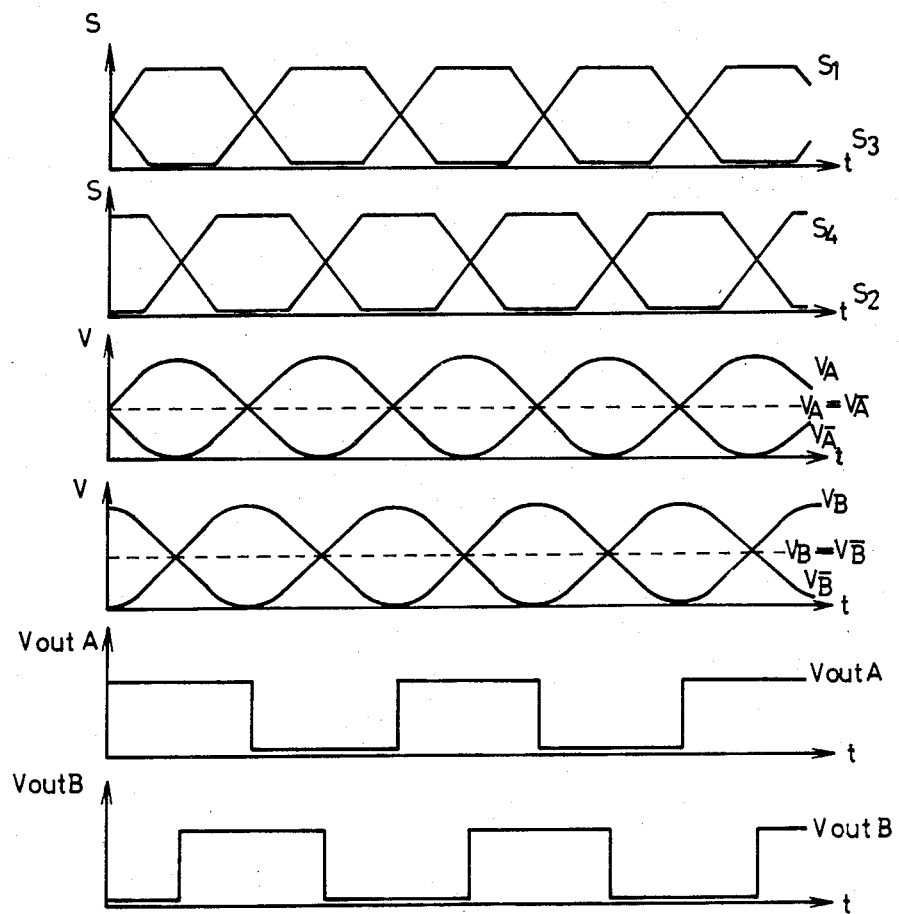
FIG. 5 is a waveform chart for explaining an operational mode of the optical rotary encoder of FIGS. 2, 3 and 4.

In response to the rotation of the slit plate 10, each of the photodiodes 301, 302, 303 and 304 is periodically exposed to the light beam emitted from the light emitting diode 160. The actual size $S_1$ of the light receiving surface of the first photodiode 301 varies as shown in FIG. 5. The actual size $S_2$ of the light receiving surface of the second photodiode 302 varies as shown in FIG. 5. The actual sizes $S_3$ and $S_4$ of the light receiving surfaces of the third and fourth photodiodes 303 and 304 vary, respectively, as shown in FIG. 5. Since the four photodiodes 30 are aligned with the interval of ¼ pitch, the variations of the actual sizes of the light receiving surfaces are offset by ¼ pitch. More specifically, the variation of the actual size $S_1$ of the first photodiode 301 leads or lags the variation of the actual size $S_2$ of the second photodiode 302 by 90° depending on the direction of rotation of the shaft 12. The variation of the actual size $S_1$ of the first of the first photodiode 301 leads or lags the variation of the actual size $S_3$ of the third photodiode 303 by 180° depending on the direction of the rotation of the shaft 12. The variation of the actual size $S_1$ of the first photodiode 301 leads or lags the variation of the actual size $S_4$ of the fourth photodiode 304 by 270° depending on the direction of the rotation of the shaft 12.

Figure 6:
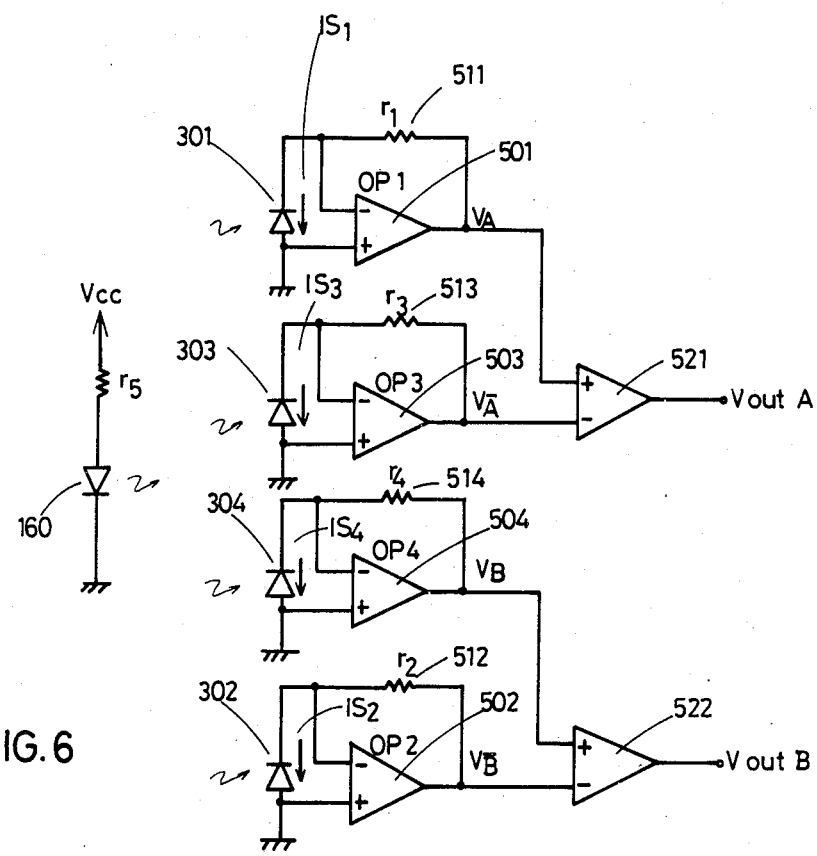
FIG. 6 is a circuit diagram of a detection circuit included in the optical rotary encoder of FIG. 3.

FIG. 6 shows the construction of the detection circuit 50. In response to the variations of the actual sizes $S_1$ through $S_4$, each of the photodiodes 301 through 304 generates optoelectric current $IS_1$, $IS_2$, $IS_3$ and $IS_4$, respectively, which is proportional to the actual sizes $S_1$ through $S_4$ of the light receiving surfaces. Each of the thus generated optoelectric currents $IS_1$, $IS_2$, $IS_3$ and $IS_4$ is applied to one of operation amplifiers 501(OP1), 502(OP2), 503(OP3) and 504(OP4). When the resistance value of a feedback resistor 511 of the operation amplifier 501(OP1) is $r_1$, an output voltage $V_A$ of the operation amplifier 501(OP1) is represented as follows.

$$V_A = r_1 \times IS_1$$

When the resistance value of a feedback resistor 512 of the operation amplifier 502(OP2) is $r_2$, an output voltage $V_{\overline{B}}$ of the operation amplifier 502(OP2) is represented as follows.

$$V_{\overline{B}} = r_2 \times IS_2$$

The output voltage $V_A$ leads or lags the output voltage $V_{\overline{B}}$ by 90° depending on the direction of the rotation of the shaft 12 as shown in FIG. 5. When the resistance value of a feedback resistor 513 of the operation amplifier 503(OP3) is $r_3$, an output voltage $V_{\overline{A}}$ of the operation amplifier 503(OP3) is represented as follows.

$$V_{\overline{A}} = r_3 \times IS_3$$

The output voltage $V_A$ of the operation amplifier 501(OP1) leads or lags the output voltage $V_{\overline{A}}$ of the operation amplifier 503(OP3) by 180° depending on the direction of the rotation of the shaft 12 as shown in FIG. 5. When the resistance value of a feedback resistor 514 of the operation amplifier 504(OP4) is $r_4$, an output voltage $V_B$ of the operation amplifier 504(OP4) is represented as follows.

$$V_B = r_4 \times IS_4$$

The output voltage $V_4$ of the operation amplifier 501(OP1) leads or lags the output voltage $V_B$ of the operation amplifier 504(OP4) by 270° depending on the direction of the rotation of the shaft 12 as shown in FIG. 5.

The output voltage $V_A$ of the operation amplifier 501(OP1), and the output voltage $V_{\overline{A}}$ of the operation amplifier 503(OP3) are applied to a first comparator 521. When the level of the output voltage $V_A$ developed from the operation amplifier 501(OP1) is greater than the level of the output voltage $V_{\overline{A}}$ of the operation amplifier 503(OP3), an output signal VoutA of the first comparator 521 bears the logic high as shown in FIG. 5. If the output voltage $V_A$ of the operation amplifier 501(OP1) is lower than the output voltage $V_{\overline{A}}$ of the operation amplifier 503(OP3), the output signal VoutA bears the logic low as shown in FIG. 5. The output voltage $V_B$ of the operation amplifier 504(OP4), and the output voltage $V_{\overline{B}}$ of the operation amplifier 502(OP2) are applied to a second comparator 522. When the level of the output voltage $V_B$ developed from the operation amplifier 504(OP4) is higher than the level of the output voltage $V_{\overline{B}}$ of the operation amplifier 502(OP2), an output signal VoutB of the second comparator 522 bears the logic high as shown in FIG. 5. Contrarily, when the output voltage $V_B$ of the operation amplifier 504(OP4) is lower than the output voltage $V_{\overline{B}}$ of the operation amplifier 502(OP2), the output signal VoutB bears the logic low as shown in FIG. 5. The thus obtained two output signals VoutA and VoutB are offset by 90°, and are utilized to obtain information regarding the angular position and velocity of the rotating shaft 12.

Figure 7:
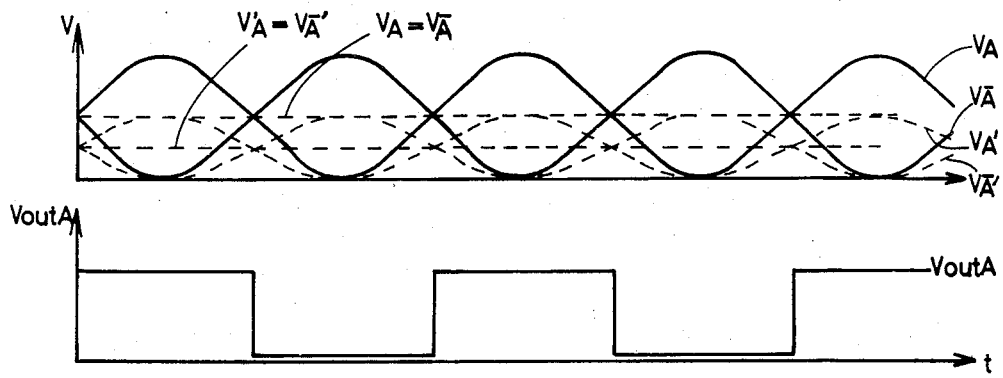
FIG. 7 is a waveform chart for explaining another operational mode of the optical rotary encoder of FIG. 3.

When the intensity of the light beam emitted from the light emitting diode 160 becomes small, the voltage level of the output voltages $V_A$, $V_{\overline{A}}$, $V_B$ and $V_{\overline{B}}$ becomes small. FIG. 7 shows the reduced output voltages $V_{A'}$ and $V_{\overline{A}'}$. It will be clear from FIG. 7 that the output signals VoutA and VoutB do not change even when the intensity of the light beam emitted from the light emitting diode 160 varies. That is, the detection circuit of FIG. 6 functions to compensate for the variations in the characteristics of the light emitting element and the light responsive elements.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An optical rotary encoder comprising: a slit plate secured to a rotating shaft, said slit plate having a plurality of circumferentially aligned slits with a predetermined pitch (P);

light emitting means for emitting a light beam toward said slit plate;

light responsive means for receiving said light beam emitted from said light emitting means after said light beam is modulated by said slits in response to rotation of said slit plate and for developing output signals related thereto;

detection circuit means for determining the angular position and velocity of said rotating shaft in accordance with said output signals developed by said light responsive means;

said light responsive means comprising first, second, third and fourth light responsive elements aligned in the tangential direction of said slit plate and being spaced at a predetermined interval which corresponds to $\frac{1}{4}$ said predetermined pitch (P), each of said elements developing a said output signal electrically independent from said output signals developed by the other of said elements;

said detection circuit means including means for developing first and second phase quadrature related relative position signals from said output signals developed by said first, second, third and fourth light responsive elements while canceling variations in said output signals caused by variations in the intensity of said light beam as received by said light responsive elements.

2. The optical rotary encoder of claim 1, wherein said four light responsive elements are formed on a common single semiconductor substrate.

3. The optical rotary encoder of claim 2, wherein said detection circuit means is also formed on said common single semiconductor substrate.

4. An optical rotary encoder comprising: a slit plate secured to a rotating shaft, said slit plate having a plurality of circumferentially aligned slits with a predetermined pitch (P);

a light emitting diode disposed at one side of said slit plate;

a plurality of photodiodes, formed on a single semiconductor substrate, disposed at the opposite side of said slit plate and developing output signals related to the intensity of light received from said light emitting diode; and detection circuit means for determining the angular position and velocity of said rotating shaft in accordance with said output signals developed by said plurality of photodiodes;

said light responsive means comprising first, second, third and fourth photodiodes aligned in the tangential direction of said slit plate at a predetermined interval which corresponds to $\frac{1}{4}$ said predetermined pitch (P), each of said photodiodes developing a said output signal electrically independent from said output signals developed by the other of said photodiodes;

said detection circuit means including means for developing first and second phase quadrature related relative position signals from said output signals developed by said first, second, third and fourth photodiodes while canceling variations in said output signal caused by variations in the intensity of said light beam as received by said photodiodes.

5. The optical rotary encoder of claim 11, wherein said detection circuit means comprises:
   a first amplifying circuit connected to said first photodiode;
   a second amplifying circuit connected to said second photodiode;
   a third amplifying circuit connected to said third photodiode; and
   a fourth amplifying circuit connected to said fourth photodiode;
   said first means for comparing including a first comparator for comparing levels of signals developed from said first amplifying circuit and said third amplifying circuit;
   said second means for comparing including a second comparator for comparing levels of signals developed from said fourth amplifying circuit and said second amplifying circuit.

6. The optical rotary encoder of claim 5, wherein said detection circuit means is also formed on said single semiconductor substrate.

7. The encoder of claim 1 wherein said means for developing cancels said variations in said output signals without varying the drive voltage to said light emitting means.

8. The encoder of claim 1 wherein said means for developing includes,
   first means for comparing said output signals developed by said first and third light responsive elements to develop said first relative position signal, and
   second means for comparing said output signals developed by said second and fourth light responsive elements to develop said second relative position signals,
   said first and second means for comparing cancelling out timing variations in said output signals caused by variations in the intensity of said light beam.

9. The encoder of claim 8 wherein said first and second means for comparing compensate for variations in output signal strength caused by variations in the intensity of said light beam by developing said relative position signals as square waves having a constant voltage at each level thereof.

10. The encoder of claim 1 wherein said means for developing cancels said variations in said output signals without varying the drive voltage to said light emitting diode.

11. The encoder of claim 4 wherein said means for developing includes,
    first means for comparing said output signals developed by said first and third photodiodes to develop said first relative position signal, and
    second means for comparing said output signals developed by said second and fourth photodiodes to develop said second relative position signal,
    said first and second means for comparing cancelling out timing variations in said output signals caused by variations in the intensity of said light beam.

12. The encoder of claim 11 wherein said first and second means for comparing compensate for variations in output signal strength caused by variations in the intensity of said light beam by developing said relative position signals as square waves having a constant voltage at each level thereof.

* * * * *